(12) United States Patent
Takebe et al.

(10) Patent No.: US 8,648,160 B2
(45) Date of Patent: Feb. 11, 2014

(54) OPTICAL SEMICONDUCTOR SEALING MATERIAL

(75) Inventors: Tomoaki Takebe, Ichihara (JP); Tsuyoshi Ota, Ichihara (JP); Yutaka Obata, Ichihara (JP); Hiroyuki Higuchi, Ichihara (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 13/587,250

(22) Filed: Aug. 16, 2012

(65) Prior Publication Data

US 2012/0305982 A1 Dec. 6, 2012

Related U.S. Application Data

(63) Continuation of application No. 11/718,855, filed as application No. PCT/JP2005/020509 on Nov. 9, 2005.

(30) Foreign Application Priority Data

Nov. 9, 2004 (JP) ................................ 2004-325000

(51) Int. Cl.
*C08F 220/10* (2006.01)
*C08F 220/28* (2006.01)

(52) U.S. Cl.
CPC ............. *C08F 220/10* (2013.01); *C08F 220/28* (2013.01)
USPC .............................. 526/282; 526/280; 438/26

(58) Field of Classification Search
USPC ..................... 526/280, 282; 438/26
See application file for complete search history.

(56) References Cited

U.S. PATENT DOCUMENTS

| 4,171,407 A | 10/1979 | Elser et al. |
| 4,563,438 A | 1/1986 | Berner et al. |

(Continued)

FOREIGN PATENT DOCUMENTS

| JP | 58-142931 | 8/1983 |
| JP | 60-124608 | 7/1985 |

(Continued)

OTHER PUBLICATIONS

Machine translated English equivalent of KR 2002002944 A, 35 pages, Jan. 2002. This corresponds to Application No. 10-2000-0037314.*

(Continued)

*Primary Examiner* — Ling Choi
*Assistant Examiner* — Brieann R Fink
(74) *Attorney, Agent, or Firm* — Oblon, Spivak, McClelland, Maier & Neustadt, L.L.P.

(57) ABSTRACT

The present invention provides an optical semiconductor sealing material comprising a radically polymerized polymer of a methacrylate ester having an alicyclic hydrocarbon group containing 7 or more carbon atoms, e.g. an adamantyl group, a norbornyl group, or a dicyclopentanyl group; and an optical semiconductor sealing material comprising a radically polymerized polymer of 50 to 97 mass % of the methacrylate ester and 3 to 50 mass % of acrylate ester having a hydroxyl group. The optical semiconductor sealing material of the present invention is highly transparent and stable to UV light and thus does not undergo yellowing. In addition, the material exhibits excellent compatibility between heat resistance and refractive index, does not undergo deformation or cracking during heating processes such as reflow soldering, and shows high processability. The material can be preferably used as a sealing material for light-emitting elements and light-receiving elements of optical semiconductor devices (semiconductor light-emitting devices).

9 Claims, 2 Drawing Sheets

Unit: mm

(56) References Cited

U.S. PATENT DOCUMENTS

| | | | |
|---|---|---|---|
| 4,591,626 | A | 5/1986 | Kawai et al. |
| 4,868,261 | A | 9/1989 | Kobayashi et al. |
| 5,041,511 | A | 8/1991 | Yanagawa et al. |
| 5,183,856 | A | 2/1993 | Kitagawa et al. |
| 5,183,870 | A | 2/1993 | Fukushima et al. |
| 5,412,049 | A | 5/1995 | Argyropoulos et al. |
| H1482 | H | 9/1995 | St. Clair et al. |
| 5,449,731 | A | 9/1995 | Suzuki et al. |
| 5,883,147 | A | 3/1999 | Masuhara et al. |
| 6,025,449 | A | 2/2000 | Enomoto et al. |
| 6,806,320 | B2 | 10/2004 | Everaerts et al. |
| 6,818,375 | B2 | 11/2004 | Koes et al. |
| 6,872,324 | B2 | 3/2005 | Maekawa et al. |
| 2005/0213926 | A1* | 9/2005 | Tabei et al. .......... 385/147 |
| 2006/0074209 | A1 | 4/2006 | Mizutani et al. |
| 2008/0015280 | A1 | 1/2008 | Takase et al. |
| 2010/0234527 | A1 | 9/2010 | Ota et al. |
| 2012/0142867 | A1 | 6/2012 | Iwasaki et al. |

FOREIGN PATENT DOCUMENTS

| | | |
|---|---|---|
| JP | 62-201913 | 9/1987 |
| JP | 63-243113 | 10/1988 |
| JP | 02-029408 | 1/1990 |
| JP | 02-067248 | 3/1990 |
| JP | 03-039304 | 2/1991 |
| JP | 06-340849 | 12/1994 |
| JP | 11-140142 | 5/1999 |
| JP | 2000-294836 | 10/2000 |
| JP | 2000-336232 | 12/2000 |
| JP | 2001-098025 | 4/2001 |
| JP | 2002-206010 | 7/2002 |
| JP | 2003-268188 | 9/2003 |
| JP | 2003-277586 | 10/2003 |
| JP | 2004-128468 | 4/2004 |
| JP | 2004-346155 | 12/2004 |
| JP | 2005-281363 | 10/2005 |
| JP | 2006-188544 | 7/2006 |
| KR | 2002-002944 | 1/2002 |
| WO | WO 00/75253 | 12/2000 |
| WO | WO 2004/048490 | 6/2004 |
| WO | WO 2004-070435 | 8/2004 |
| WO | WO 2005/088372 | 9/2005 |

OTHER PUBLICATIONS

CAPlus Abstract of KR 2002-002944 (or application KR 2000-37314).*

Machine translated equivalent of JP 2006-188544 (34 pages, 2006).*

Derwent Abstract of JP 60-124608 (Acc. No. 1985-199523, Jul. 1985).*

TCI Europe (Product Details: Dicyclopentanyl Methacrylate), Copyright 2009, p. 1-2.

International Search Report in International Application No. PCT/JP2005/020509, dated Jan. 31, 2006.

* cited by examiner

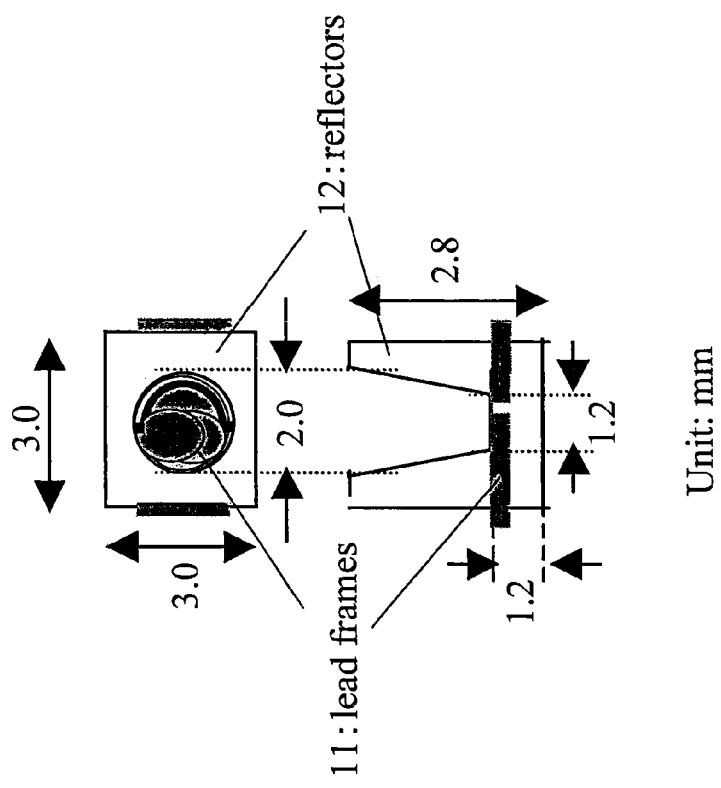

OPTICAL SEMICONDUCTOR SEALING MATERIAL

This application is a Continuation of U.S. application Ser. No. 11/718,855, filed on May 8, 2007, which is a National Stage of PCT/JP05/20509, filed Nov. 9, 2005.

TECHNICAL FIELD

The present invention relates to sealing materials for light-emitting elements and light-receiving elements of optical semiconductor devices or semiconductor light-emitting devices, to photovoltaic elements, and to photovoltaic devices. In particular, the present invention relates to a transparent sealing material that does not undergo yellowing by ultraviolet (UV) rays, exhibits excellent compatibility between heat resistance and refractive index, and exhibits excellent processability, and to a photovoltaic element and a photovoltaic device using this sealing material.

BACKGROUND ART

Optical semiconductor devices (semiconductor light-emitting devices) provided with light emitting diode (LED) chips as light-emitting elements have been widely used in various display apparatuses. Such LED chips have light-emitting layers composed of p-n junctions between semiconductor layers deposited on crystal substrates.

Examples of the optical semiconductor devices include visible light emitting devices and high-temperature operating electronic devices composed of gallium nitride compounds such as GaN, GaAlN, InGaN, and InAlGaN. Furthermore, blue light emitting diodes and UV light emitting diodes are now being developed.

An optical semiconductor device is provided with an LED chip as a light-emitting element mounted on a light-emitting surface of a lead frame. The LED chip and the lead frame are electrically connected by wire bonding, and these are encapsulated by a resin that protects the light-emitting element and functions as a lens.

In recent years, white LEDs have drawn attention as new light sources, and the market will be greatly expanded mainly in illumination applications. White LEDs in practical use are categorized into GaN bare chips coated with YAG phosphors that emit white light by color mixing of blue light emitted by GaN and yellow light from the phosphors, and a package of red, green and blue three chips. Nowadays, a combination of an UV LED light source and a plurality of phosphors is also being developed in order to improve hue. In addition, endurance is required for LEDs for illumination applications.

Epoxy resins, which are transparent and exhibit good processability, are generally used as sealing materials for encapsulating light-emitting elements such as LED chips. In general, epoxy resins for LED encapsulation are composed of bisphenol A glycidyl ethers, methylhexahydrophthalic anhydride, and amine- or phosphorus-base hardeners. Unfortunately, these components generate carbonyl groups, which cause yellowing of the resins, by UV ray absorption. In order to solve this problem, use of hydrogenated bisphenol A glycidyl ether is proposed (Nonpatent Document 1). This resin, however, does not yet exhibit satisfactory properties.

Silicone resins are widely used to suppress yellowing or a decrease in brightness caused by UV rays. Silicone resins, which are highly transparent in the UV region, barely undergo yellowing and a decrease in transparency by UV rays. Disadvantages of silicone resins are low light output efficiency due to a low refractive index and poor adhesion with lead frames or reflectors due to low polarity.

In surface mount LEDs, reflow soldering is generally carried out. In reflow furnaces, workpieces are exposed to heat at 260° C. for about 10 seconds. Conventional epoxy resins and silicone resins undergo thermal deformation or cracking in some cases.

[Nonpatent Document 1] The New Energy and Industrial Technology Development Organization (NEDO) "Report on High-Efficiency Electro-Optic Conversion Compound Semiconductor Development, Plan for Light of 21C, 2001"

DISCLOSURE OF INVENTION

Under such a situation, an object of the present invention is to provide a transparent optical semiconductor sealing material that does not undergo yellowing by UV rays, exhibits excellent compatibility between heat resistance and refractive index, and exhibits excellent adhesiveness and processability, and to provide a photovoltaic element and a photovoltaic device.

As a result of intensive study to achieve this object, the inventors have discovered that an optical semiconductor sealing material having a satisfactory refractive index and excellent processability can be prepared from a polymer by radical polymerization of a methacrylate ester having an alicyclic hydrocarbon group containing seven or more carbon atoms, that a thermosetting resin composition containing this methacrylate ester having an alicyclic hydrocarbon group and an acrylate ester having a hydroxyl group can provide hardened materials that exhibit excellent adhesion and processability, are stable to UV light and resistive to yellowing, and exhibit satisfactory compatibility between heat resistance and refractive index, and that this composition is suitable for an optical semiconductor sealing material. The present invention has been accomplished based on such findings.

The present invention provides an optical semiconductor sealing material, a photovoltaic element, and a photovoltaic device, as follows:

(1) An optical semiconductor sealing material comprising a radically polymerized polymer of a methacrylate ester having an alicyclic hydrocarbon group containing 7 or more carbon atoms.
(2) The optical semiconductor sealing material of aspect (1), further comprising 0.5 to 20 mass % thermoplastic resin.
(3) The optical semiconductor sealing material of aspect (1) or (2), wherein the alicyclic hydrocarbon group containing 7 or more carbon atoms is an adamantyl group, a norbornyl group, or a dicyclopentanyl group.
(4) An optical semiconductor sealing material comprising a radically polymerized polymer of 50 to 97 mass % methacrylate ester having an alicyclic hydrocarbon group containing 7 or more carbon atoms and 3 to 50 mass % acrylate ester having a hydroxyl group.
(5) The optical semiconductor sealing material of aspect (4), wherein the alicyclic hydrocarbon group containing 7 or more carbon atoms is an adamantyl group, a norbornyl group, or a dicyclopentanyl group.
(6) A photovoltaic element comprising the optical semiconductor sealing material of any one of aspects (1) to (5).
(7) A photovoltaic device comprising the photovoltaic element of aspect (6).

BRIEF DESCRIPTION OF THE DRAWINGS

FIG. 2 is a schematic view of an apparatus for measuring a bonding number with a reflector in an adhesion test according to an embodiment.

BEST MODE FOR CARRYING OUT THE INVENTION

Figure 1:
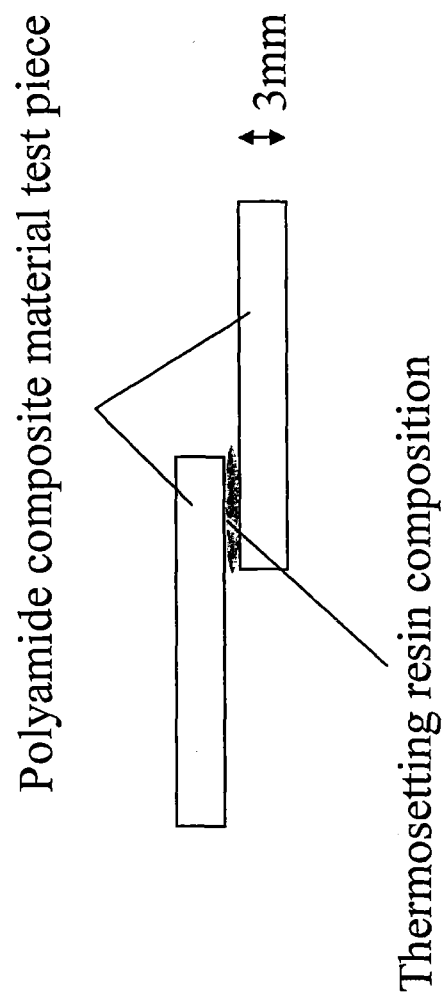
FIG. 1 is a schematic view of an adhesion state of a test piece for measuring adhesive strength in an adhesion test according to an embodiment.

The optical semiconductor sealing material of the present invention comprises a radically polymerized polymer of a methacrylate ester having an alicyclic hydrocarbon group containing 7 or more carbon atoms.

Examples of the alicyclic hydrocarbon group containing 7 or more carbon atoms include a 2-decahydronaphthyl group, adamantyl groups, a 1-methyladamantyl group, a 2-methyladamantyl group, a biadamantyl group, a dimethyladamantyl group, a norbornyl group, a 1-methylnorbornyl group, a 5,6-dimethylnorbornyl group, an isobornyl group, a tetracyclo[$4.4.0.1^{2,5}.1^{7,10}$]dodecyl group, a 9-methyltetracyclo[$4.4.0.1^{2,5}.1^{7,10}$]dodecyl group, a bornyl group, and a dicyclopentanyl group. Among them, adamantyl groups, norbornyl groups, and a dicyclopentanyl group are preferred. Adamantyl groups are more preferred and a 1-adamantyl group is most preferred. Monomers used for the optical semiconductor sealing material of the present invention are methacrylates having these alicyclic hydrocarbon groups. If the carbon number of the alicyclic hydrocarbon group is less than 7, the heat resistance and refractive index are often insufficient. If the ester substituent of the methacrylate ester has an aromatic group, UV degradation will readily occur.

The radically polymerized polymer of the methacrylate ester having an alicyclic hydrocarbon group contained in the optical semiconductor sealing material of the present invention may be a homopolymer of the methacrylate esters having an alicyclic hydrocarbon group containing 7 or more carbon atoms, or a copolymer of two or more species selected from the above-mentioned methacrylate esters. Alternatively, the radically polymerized polymer may be a copolymer of one or more methacrylate esters each having an alicyclic hydrocarbon group containing 7 or more carbon atoms and one or more species selected from other (meth)acrylate esters as comonomers. Examples of the other (meth)acrylate esters include acrylic esters, such as methyl acrylate, fluoromethyl acrylate, ethyl acrylate, butyl acrylate, isobutyl acrylate, tert-butyl acrylate, 2,2,2-trifluoroethyl acrylate, 2-hydroxyethyl acrylate, 1,2,2,2-tetrachloroethyl acrylate, propyl acrylate, isopropyl acrylate, 2-chloro-1-(chlorodifluoromethyl)ethyl acrylate, 1,2,2,2-tetrafluoro-1-(trifluoromethyl)ethyl acrylate, 2,2,2-trifluoro-1-(trifluoromethyl)ethyl acrylate, 2,2,3,3,3-pentafluoropropyl acrylate, 1-methylethyl acrylate, 2-(methylthio)ethyl acrylate, 2-methoxyethyl acrylate, 2-hydroxypropyl acrylate, 2-propenyl acrylate, 1-ethoxy-2,2,2-trifluoroethyl acrylate, 2-(ethylthio)ethyl acrylate, 2-ethoxyethyl acrylate, 2,2,3,3,4,4,4-heptafluorobutyl acrylate, 3-(methylthio)propyl acrylate, 1-methylpropyl acrylate, 2,2,3,4,4,4-hexafluorobutyl acrylate, 4-oxapentyl acrylate, 2-(trifluoroethoxy)ethyl acrylate, 2-(1,1,2,2-tetrafluoroethoxy)ethyl acrylate, 3-(ethylthio)propyl acrylate, 1-ethylpropyl acrylate, 2,2,3,3,4,4,5,5-octafluoropentyl acrylate, 2,2-dimethylpropyl acrylate, 2,2,3,3,4,4,5,5,5-nonafluoropentyl acrylate, 4-methylthiobutyl acrylate, 2-methylbutyl acrylate, 3-methylbutyl acrylate, 4-oxahexyl acrylate, 3-methoxybutyl acrylate, hexyl acrylate, cyclohexyl acrylate, 2-ethylbutyl acrylate, 2-methylpentyl acrylate, 4-methyl-2-pentyl acrylate, phenyl acrylate, 2-chlorophenyl acrylate, 4-chlorophenyl acrylate, 2,4-dichlorophenyl acrylate, pentachloro acrylate, 3,3,4,4,5,5,6,6,6-undecafluoro acrylate, pentafluoro acrylate, heptyl acrylate, phenylmethyl acrylate, 2-methylphenyl acrylate, 3-methylphenyl acrylate, 4-methylphenyl acrylate, 1-methylhexyl acrylate, 4-methoxyphenyl acrylate, octyl acrylate, 2-phenylethyl acrylate, 1-methylheptyl acrylate, nonyl acrylate, and decyl acrylate; and methacrylic esters, such as methyl methacrylate, ethyl methacrylate, 2-chloroethyl methacrylate, 2,2,2-trifluoroethyl methacrylate, 2-nitroethyl methacrylate, 2-hydroxyethyl methacrylate, propyl methacrylate, isopropyl methacrylate, 2-methoxyethyl methacrylate, allyl methacrylate, glycidyl methacrylate, 2-chloropropyl methacrylate, trimethylsilyl methacrylate, 2,2,2-trifluoro-1-methylethyl methacrylate, 2,2,3,3-tetrafluoropropyl methacrylate, heptafluoroisopropyl methacrylate, hexafluoroisopropyl methacrylate, butyl methacrylate, isobutyl methacrylate, sec-butyl methacrylate, tert-butyl methacrylate, 2-ethoxyethyl methacrylate, diethylene glycol methacrylate, nonafluoro-tert-butyl methacrylate, 2,2,3,3,4,4,4-heptafluorobutyl methacrylate, pentyl methacrylate, cyclopentyl methacrylate, 2,2-diethylpropyl methacrylate, 1-methylbutyl methacrylate, isoamyl methacrylate, 2,2,3,3,4,4,5,6-octafluoropentyl methacrylate, hexyl methacrylate, cyclohexyl methacrylate, phenyl methacrylate, 3,3-dimethylbutyl methacrylate, 2-ethylbutyl methacrylate, 1-methylcyclohexyl methacrylate, 2-methylcyclohexyl methacrylate, 3-methylcyclohexyl methacrylate, 4-methylcyclohexyl methacrylate, 1,1-diethylpropyl methacrylate, 2-methylphenyl methacrylate, 3-methylphenyl methacrylate, 4-methylphenyl methacrylate, benzyl methacrylate, 2-methoxyphenyl methacrylate, 2,2,3,3,4,4,5,5,6,6,7,7-dodecafluoroheptyl methacrylate, octyl methacrylate, 2-ethylhexyl methacrylate, 2-phenylethyl methacrylate, 2,4-dimethylphenyl methacrylate, 2,5-dimethylphenyl methacrylate, 2,6-dimethylphenyl methacrylate, 3,5-dimethylphenyl methacrylate, nonyl methacrylate, decyl methacrylate, and isodecyl methacrylate.

However, the use of (meth)acrylate esters having aromatic rings as comonomers is not preferred. The comonomer content in the polymer is in the range of preferably 50 mole % or less, more preferably 30 mole % or less. A content exceeding 50 mole % may deteriorate the compatibility of the refractive index, heat resistance, and light resistance.

The number of tertiary carbon atoms contained in the alicyclic hydrocarbon group is preferably 8 or less, and more preferably 5 or less. If the number of tertiary carbon atoms contained in the ester moiety exceeds 8, yellowing will occurs in some cases.

Examples of radical polymerization initiators used in the radical polymerization for the optical semiconductor sealing material of the present invention include ketone peroxides, such as methyl ethyl ketone peroxide, methyl isobutyl ketone peroxide, acetylacetone peroxide, cyclohexanone peroxide, and methylcyclohexanone peroxide; hydroperoxides, such as 1,1,3,3-tetramethylbutylhydroperoxide, cumene hydroperoxide, and t-butyl hydroperoxide; diacyl peroxides, such as diisobutyryl peroxide, bis(3,5,5-trimethylhexanol) peroxide, lauroyl peroxide, benzoyl peroxide, and m-toluyl benzoyl peroxide; dialkyl peroxides, such as dicumyl peroxide, 2,5-dimethyl-2,5-di(t-butylperoxy)hexane, 1,3-bis(t-butylperoxyisopropyl)hexane, t-butyl cumyl peroxide, di-t-butyl peroxide, and 2,5-dimethyl-2,5-di(t-butylperoxy) hexene; peroxyketals, such as 1,1-di(t-butylperoxy-3,5,5-trimethyl)cyclohexane, 1,1-di-t-butylperoxycyclohexane, and 2,2-di(t-butylperoxy)butane; alkylperesters, such as 1,1,3,3-tetramethylbutylperoxyneodicarbonate, α-cumylperoxyneodicarbonate, t-butylperoxyneodicarbonate, t-hexyl peroxypivalate, t-butyl peroxypivalate, 1,1,3,3-tetramethylbutyl peroxy-2-ethylhexanoate, t-amyl peroxy-2-ethylhexanoate, t-butyl peroxy-2-ethylhexanoate, t-butyl peroxyisobutyrate, di-t-butyl peroxyhexahydroterephthalate, 1,1,3,3-tetramethylbutyl peroxy-3,5,5-trimethylhexanoate, t-amyl peroxy-3,5,5-trimethylhexanoate, t-butyl peroxy-3,5,5-trimethylhexanoate, t-butyl peroxyacetate, t-butyl peroxybenzoate, and dibutyl peroxytrimethyladipate; and peroxycarbonates, such as di-3-methoxybutyl peroxydicarbonate, di-2-ethylhexyl peroxydicarbonate, bis(1,1-butylcyclohexaoxy dicarbonate), diisopropyloxy dicarbonate, t-amylperoxy isopropyl carbonate, t-butylperoxy isopropyl carbonate, t-butylperoxy 2-ethylhexyl carbonate, and 1,6-bis(t-butylperoxycarboxy)hexane.

The amount of the radical polymerization initiator used is in the range of generally 0.01 to 5 parts by mass and preferably 0.05 to 1.0 parts by mass for 100 parts by mass of the total monomer. The radical polymerization initiators may be used alone or in combination.

Any crosslinkable monomer may be used, in addition to the radical polymerization initiator to enhance the strength. Examples of the crosslinkable monomer include 1,4-butanediol(meth)acrylate, 1,6-hexanediol di(meth)acrylate, 1,9-nonanediol di(meth)acrylate, neopentyldiol di(meth)acrylate, polyethylene glycol di(meth)acrylate, polypropylene glycol di(meth)acrylate, ethylene oxide-modified bisphenol A di(meth)acrylate, propylene oxide-modified bisphenol A di(meth)acrylate, epichlorohydrin-modified bisphenol A di(meth)acrylate, propylene oxide-modified glycerol tri(meth)acrylate, trimethylolpropane tri(meth)acrylate, ditrimethylolpropane tetra(meth)acrylate, dipentaerythritol hexa(meth)acrylate, and tris(acroyloxyethyl) isocyanurate. These crosslinkable monomers may be used alone or in combination. The crosslinkable monomer content is in the range of preferably 0.1 to 80 mass %, more preferably 1 to 70 mass %, and most preferably 2 to 50 mass % in the total monomer. A crosslinkable monomer content of less than 0.1 mass % fails to enhance the strength by crosslinking.

The optical semiconductor sealing material according to the present invention may contain a thermoplastic resin to improve heat resistance. Such a thermoplastic resin desirably has high transparency and a glass transition temperature of 120° C. or more. A glass transition temperature of less than 120° C. suppresses enhancement of heat resistance.

Examples of such thermoplastic resins include polymethacrylates, polystyrenes, polycarbonates, polyaryl esters, polyethersulfones, epoxy acrylates, olefin-maleimide copolymers, ZEONEX (cycloolefin copolymers made by ZEON Corporation), ZEONOR (cycloolefin copolymers made by ZEON Corporation), ARTON (cycloolefin copolymers made by JSR Corporation), TOPAS (cycloolefin copolymers made by Ticona), transparent ABS resins, transparent propylene resins, methacrylate-styrene (MS) resins, polyarylates, polysulfones, transparent nylons, transparent polybutylene terephthalate, transparent fluorinated resins, poly-4-methylpentene-1, and transparent phenoxy resins. These thermoplastic resins may be used in combination. Preferably, the thermoplastic resin should be contained in the semiconductor sealing material in an amount of 0.5 to 20 mass %. A thermoplastic resin content of 0.5 mass % or more improves heat resistance and a content of 20 mass % or less ensures high fluidity.

A preferred embodiment of the optical semiconductor sealing material of the present invention is a radically polymerized polymer of a methacrylate ester having an alicyclic hydrocarbon group containing 7 or more carbon atoms and an acrylate ester having a hydroxyl group.

Examples of the acrylate ester having a hydroxyl group used for the optical semiconductor sealing material of the present invention include 2-hydroxyethyl methacrylate, 2-hydroxypropyl methacrylate, 2-hydroxyethyl acrylate, 2-hydroxypropyl acrylate, 2-hydroxybutyl methacrylate, glycerol dimethacrylate, 2-hydroxy-3-acryloyloxypropyl methacrylate, 2-hydroxybutyl acrylate, 2-hydroxy-3-phenoxypropyl acrylate, 2-hydroxy-3-acryloyloxypropyl acrylate, 2-hydroxy-3-phenoxypropyl acrylate, hexahydrophthalic acid diglycidyl ester modified with acrylic acid, ethylene glycol diglycidyl ether modified with methacrylic acid, polyethylene glycol glycidyl ether modified with methacrylic acid, diethylene glycol diglycidyl ether modified with methacrylic acid, and 1,4-butanediol diglycidyl ether diacrylate. Among these, preferably used are hexahydrophthalic acid diglycidyl ester modified with acrylic acid, ethylene glycol diglycidyl ether modified with methacrylic acid, polyethylene glycol glycidyl ether modified with methacrylic acid, diethylene glycol diglycidyl ether modified with methacrylic acid, and 1,4-butanediol diglycidyl ether diacrylate.

In the combination of the methacrylate ester having an alicyclic hydrocarbon group containing 7 or more carbon atoms and the acrylate ester having a hydroxyl group in the optical semiconductor sealing material of the present invention, the content of methacrylate ester having an alicyclic hydrocarbon group containing 7 or more carbon atoms is in the range of generally 50 to 97 mass %, and preferably 60 to 95 mass %, and the content of acrylate ester having a hydroxyl group is in the range of generally 3 to 50 mass %, and preferably 5 to 40 mass %. Such ranges of the methacrylate ester having an alicyclic hydrocarbon group containing 7 or more carbon atoms and the acrylate ester having a hydroxyl group lead to a cured thermosetting resin composition that is stable to UV rays and resistive to yellowing and exhibits good compatibility between heat resistance and adhesiveness.

The thermosetting resin composition described above exhibits sufficiently high adhesiveness to plastic molded articles and thus can be preferably used as an adhesive agent. Preliminary activation of surfaces of the plastic molded articles by UV irradiation treatment, ozone treatment, plasma treatment, corona discharge treatment, or high-voltage treatment can enhances adhesiveness.

In the present invention, the thermosetting resin composition represents a resin composition that can be thermally polymerized. The resulting polymerized resin does not always have a three-dimensional cross-linked structure, and may be a linear resin. The resin is not always insoluble and infusible, and may be thermoplastic.

The UV irradiation treatment involves irradiation of surfaces of plastic molded articles with UV rays in air. Examples of light sources for UV irradiation include low-pressure mercury lamps, high-pressure mercury lamps, ultrahigh-pressure mercury lamps, xenon lamps, and metal halide lamps. UV irradiation generates radicals on the plastic and activated oxygen derived from oxygen in air. These react with each other to form polar groups, such as —COOH, —COH, and —C=O, which contribute an improvement in adhesion, on the surfaces of the plastic. Energy of UV rays used for irradiation of the plastic molded articles depends on the type and shape of the plastic and the type of the lamp. It is preferred that the irradiation energy be in the range of 10 to 20,000 mJ/cm$^2$, more preferably 100 to 10,000 mJ/cm$^2$ in order to enhance adhesiveness to the thermosetting resin composition of the present invention. An irradiation energy exceeding 20,000 mJ/cm$^2$ may cause deterioration of the surfaces of the plastic molded articles. A low irradiation energy of less than 10 mJ/cm$^2$ often lead to insufficient adhesion. The irradiation energy is controlled by the distance between the molded article and the lamp and the irradiation time. According to a preferred embodiment, the distance between the molded articles and the lamp is about 1 to about 50 cm, more preferably 5 to 30 cm. The irradiation time is generally about 5 seconds to about 10 minutes, and preferably about 10 seconds to about 5 minutes. A distance between the molded article and the lamp of less than 1 cm or exceeding 50 cm or an irradiation time of less than 5 seconds or exceeding 10 minutes will fail to control the irradiation energy within the range of 10 to 20,000 mJ/cm$^2$.

The ozone treatment is carried out by bringing the surface of the plastic molded article into contact with ozone molecules for oxidative modification of the surface. The ozone treatment involves exposure of the plastic molded article to ozone. Any exposure process, for example, exposure to an ozone atmosphere or in an ozone stream for a predetermined time may be employed. Ozone can be generated by supplying oxygen-containing gas, such as air, gaseous oxygen, or oxygen-enriched air to an ozone generator. The resulting ozone-containing gas is introduced into a vessel or container containing a plastic molded article during the ozone treatment. A possible mechanism of the ozone treatment is formation of hydroperoxy groups on the surface of the plastic molded article by primarily oxidation reaction, these groups being partially converted into hydroxy groups and carbonyl groups.

The plasma treatment is carried out by placing the plastic molded article into a vessel containing argon, neon, helium, nitrogen, nitrogen dioxide, oxygen, or air, then exposing it to plasma generated by glow discharge to introduce functional groups containing oxygen, nitrogen or the like on the surface of the molded article. Examples of discharge modes for plasma generation include (1) DC discharge or low-frequency discharge, (2) radiowave discharge, and (3) microwave discharge.

The corona discharge treatment involves generating corona discharge by applying a high voltage of several thousand volts between a metal roller and knife-edged electrodes arranged at an interval of several millimeters, and by feeding the plastic molded article between the roller and the electrodes during the discharge.

High-voltage discharge treatment involves moving plastic articles on a belt conveyer in a tunnel-shaped processing unit while a high voltage of several hundred thousand volts is applied between multiple electrodes provided on the inner wall of the processing unit for discharge in air. By the discharge, oxygen in the air and the surface of the plastic molded article are activated such that oxygen is trapped on the surface of the plastic and polar groups are formed on the surface.

The optical semiconductor sealing material of the present invention may further contain other additives, for example, antioxidants and light stabilizers. Examples of antioxidants include phenolic antioxidants, phosphorus-based antioxidants, sulfur-based antioxidants, vitamin-based antioxidants, lactone antioxidants, and amine antioxidants.

Examples of the phenolic antioxidants include commercially available products, such as Irganox 1010, Irganox 1076, Irganox 1330, Irganox 3114, Irganox 3125, and Irganox 3790 (trademarks by Ciba Specialty Chemicals), 3,5-di-t-butyl-4-hydroxytoluene (BHT), Cyanox 1790 (trademark by Cyanamid), and Sumilizer GA-80 (trademark by Sumitomo Chemical Co. Ltd.)

Examples of the phosphorus-based antioxidants include commercially available products, such as Irgafos 168, Irgafos 12, and Irgafos 38 (trademarks by Ciba Specialty Chemicals); ADKSTAB 329K, ADKSTAB PEP-36, and ADKSTAB PEP-8 (trademarks by ADEKA CORPORATION); Sardstab P-EPQ (trademark by Clariant); and Weston 618, Weston 619G, and Weston 624 (trademarks by GE Specialty Chemicals, Inc).

Examples of the sulfur-based antioxidants include commercially available products, such as DSTP "Yoshitomi", DLTP "Yoshitomi", DLTOIB "Yoshitomi", and DMTP "Yoshitomi" (trademarks by API Corporation), Seenox 412S (trademark by SHIPRO KASEI KAISHA, LTD.), and Cyanox 1212 (trademark by Cyanamid).

Examples of the vitamin-based antioxidants include commercially available products, such as tocopherol and Irganox E201 (trademark by Ciba Specialty Chemicals, chemical name: 2,5,7,8-tetramethyl-2(4',8',12'-trimethyltridecyl)coumarone-6-ol).

Lactone antioxidants that can be used are disclosed in Japanese Unexamined Patent Application Publication Nos. 7-233160 and 7-247278. Another example is HP-136 (trademark by Ciba Specialty Chemicals, chemical name: 5,7-di-tert-butyl-3-(3,4-dimethylphenyl)3H-benzofuran-2-one).

Examples of the amine antioxidants include commercially available products, such as Irgastab FS042 (trademark by Ciba Specialty Chemicals), and GENOX EP (trademark by GE Specialty Chemical, chemical name: dialkyl-N-methylamine oxide).

These additives are used in an amount of generally 0.005 to 5 parts by mass, and preferably 0.02 to 2 parts by mass to 100 parts by mass of overall resin components. These additives may be used alone or in combination.

The optical semiconductor sealing material of the present invention may contain any known light stabilizer. Preferable light stabilizers are hindered-amine light stabilizers. Examples of commercially available light stabilizers include ADK STAB LA-52, LA-57, LA-62, LA-63, LA-67, LA-68, LA-77, LA-82, LA-87, and LA-94 made by ADEKA CORPORATION; Tinuvin 123, Tinuvin 144, Tinuvin 440, Tinuvin 662, Chimassorb 2020, Chimassorb 119, and Chimassorb 944 made by Chiba Specialty Chemicals; Hostavin N30 made by Hoechst; Cyasorb UV-3346 and UV-3526 made by Cytec Industries; Uval 299 made by GLC; and Sanduvor PR-31 made by Clariant.

The content of the light stabilizer is in the range of generally 0.005 to 5 parts by weight, and preferably 0.002 to 2 parts by weight to 100 parts by mass of overall resin components. These light stabilizers may be used alone or in combination. Furthermore, various phosphors may be added.

The optical semiconductor sealing material of the present invention can be used for encapsulation of any element without restriction. Examples of such elements include light-emitting diode (LED) chips, semiconductor lasers, photodiodes, photointerruptors, photocouplers, phototransistors, electroluminescent elements, charge-coupled devices (CCDs), and solar cells. An example of the photovoltaic devices according to the present invention is an LED encapsulated with the optical semiconductor sealing material of the present invention, and examples of the photovoltaic device include a variety of semiconductor devices, such as lighting devices and signal devices made of the LEDs.

EXAMPLES

The present invention will now be described in further detail by examples, but the present invention should not be limited by these examples.

Physical properties of (hardened) optical semiconductor sealing materials prepared by examples and comparative examples are evaluated as follows:
(1) Glass Transition Temperature
The glass transition temperature Tg was determined from a discrete point of a heat flux curve that was observed by holding 10 mg of sample at 50° C. for 5 minutes in nitrogen atmosphere and then heating it at 20° C./min using a differential thermal calorimeter DSC-7 (made by Perkin Elmer).

(2) Light Transmission

The light transmission (%) was determined according to JIS K7105 using a test piece having a thickness of 3 mm. The instrument used was HGM-2DP (made by Suga Test Instrument Co. Ltd.).

Then, the sample was held in a thermostatic oven at 140° C. for 100 hours, and the differential transmission (%) was determined from the difference of the light transmission between the unaged sample and the aged sample.

(3) Transmittance at 400 nm

The transmittance was measured within the wavelength range of 200 nm to 700 nm using a UV-VIS Spectrophotometer UV-2400PC (made by SHIMADZU Corporation).

(4) Weathering Test (Measurement of $\Delta YI$)

The yellowness index (YI) was measured according to JIS K7105 using a test piece having a thickness of 3 mm. Using an SZ-optical sensor (made by Nippon Denshoku Industries Co. Ltd.), the following values were determined:

$\Delta YI^1$: The sample was irradiated with UV light of 500 W/m$^2$ for 100 hours using a weatherometer Solarbox 1500e (JASCO International Co. Ltd.), and $\Delta YI^1$ was determined by the difference of YI's between the unirradiated sample and the irradiated sample.

$\Delta YI^2$: The sample was held in a thermostatic oven at 140° C. for 100 hours, and $\Delta YI^2$ was determined by the difference of YI's between the unaged sample and the aged sample.

(5) Flexural Modulus: The Flexural Modulus was Determined According to JIS K7203.

(6) Softening Point

The softening point was measured at a heating rate of 5° C./min under a load of 49 mN with a columnar sample with a length of 10 mm and a side of 3 mm using a thermal mechanical analyzer TMA/SS6100 (made by Seiko Instruments Inc.).

(7) Refractive Index

The refractive index was determined at 25° C. using a refractive index meter made by Elmer.

(8) Adhesion Test

Adhesive strength: A liquid thermosetting resin composition was applied to a region (area: 20 mm by 13 mm) of 20 mm from one side of a polyamide composite material test piece [a](64 mm by 13 mm by 3 mm), a test piece having the same size was placed thereon, and these test pieces were bonded by thermal hardening under predetermined conditions (see FIG. 1). The sample was subjected to a tensile test at a tensile rate of 20 mm/min. The adhesive strength was determined by the maximum load (N).

Number of components bonded with reflectors: Ten parts as shown in FIG. 2 were each prepared by integral molding of a polyamide composite material [b] and a lead frame. The concavity of each component was filled with a liquid thermosetting resin composition, and the composition was thermally hardened under predetermined conditions. The adhesion state between the hardened composition and the reflector of each component was observed. The number of unseparated samples among ten components was counted.

(Remarks)

(a) A test piece prepared by injection molding at a barrel temperature of 280° C. and a mold temperature of 120° C. using pellets of the polyamide composite material described in (b) below after the pellets were dried at 70° C. for a day.

(b) Pellets prepared as follows: Semi-aromatic polyamide AMODEL A4000 (Solvay Advanced Polymers), titanium oxide PF-726 (ISHIHARA SANGYO KAISHA, LTD.), and glass fiber JAFT 164G (ASAHI FIBER GLASS Co. Ltd) were compounded at a proportion of 70/10/20 (mass ratio) and dry-blended. The mixture was pelletized using a biaxial extruder with an inner diameter of 30 mm at a barrel temperature of 285° C.

(c) The adhesion tests were carried out for both UV-unirradiated samples and UV-irradiated samples of the polyamide composite material test pieces and lead frame integral mold components. These samples were irradiated with UV rays of 1000 mJ/cm$^2$ using a high-voltage mercury lamp (3 kW Eyegrantage ECS-301G1, made by EYE GRAPHICS CO. LTD., 120W, irradiation distance: 15 cm), as a UV irradiation unit.

Example 1

A curable composition was prepared by mixing 21 g of 1-adamantyl methacrylate (made by Idemitsu Kosan Co., Ltd.) with 0.021 g of 1,1-bis(t-butylperoxy)-3,3,5-trimethylcyclohexane (PERHEXA 3M-95 made by NOF CORPORATION) as a radical polymerization initiator. This composition was fed into a cell that was defined by two glass plates separated by a Teflon spacer with thickness of 3 mm. The cell was heated at 100° C. for 1 hour, 110° C. for 1 hour, 120° C. for 1 hour, and then 130° C. for 30 minutes in an oven, and then gradually cooled to room temperature to form a colorless transparent hardened plate article. The observed properties of the hardened article are shown in Table 1.

Example 2

A hardened article was prepared as in Example 6, except that the monomer was changed to dicyclopentanyl methacrylate (FANCRYL FM-513 made by Hitachi Chemical Company, Ltd.) and the radical polymerization initiator was changed to azobisisobutyronitrile (made by TOKYO CHEMICAL INDUSTRY CO. LTD.) in Example 1. The observed properties of the hardened article are shown in Table 1.

Example 3

A hardened article was prepared as in Example 6, except that the monomer was changed to isobornyl methacrylate (made by Wako Pure Chemical Industries, Ltd.). The observed properties of the hardened article are shown in Table 1.

Example 4

A hardened article was prepared as in Example 1, except that the monomer was changed to norbornyl methacrylate (made by Wako Pure Chemical Industries, Ltd.). The observed properties of the hardened article are shown in Table 1.

Example 5

A hardened article was prepared as in Example 1, except that 0.42 g of ethylene glycol dimethacrylate (made by Wako Pure Chemical Industries, Ltd.) was further added as a crosslinkable monomer. The observed properties of the hardened article are shown in Table 1.

Example 6

A hardened article was prepared as in Example 5, except that 2.1 g of thermoplastic resin TOPAS 8007 (made by Ticona) was uniformly dissolved by agitation at room temperature. The observed properties of the hardened article are shown in Table 1.

Example 7

A curable composition was prepared by mixing 21 g of 1-adamantyl methacrylate (made by Idemitsu Kosan Co., Ltd.) with 0.021 g of 1,1-bis(t-butylperoxy)-3,3,5-trimethylcyclohexane (PERHEXA 3M-95 made by NOF CORPORATION) and 0.021 g of diisopropylbenzene hydroperoxide (PERCUMYL P made by NOF CORPORATION) as radical polymerization initiators. This composition was fed into a cell that was defined by two glass plates separated by a Teflon spacer with thickness of 3 mm. The cell was heated at 100° C. for 1 hour, 110° C. for 1 hour, 120° C. for 1 hour, and then 130° C. for 30 minutes, was heated to 200° C. at a rate of 2° C./min, in an oven, and then the cell was gradually cooled to room temperature to form a colorless transparent hardened plate article. The observed properties of the hardened article are shown in Table 1.

Example 8

A curable composition was prepared by mixing 22 g of 1-adamantyl methacrylate (made by Idemitsu Kosan Co., Ltd.) with 2.5 g of methyl methacrylate (made by Sigma Aldrich Japan) as a monomer and 0.068 g of bis(4-t-butylcyclohexyl) peroxydicarbonate (PERROYL TCP made by NOF CORPORATION) as a radical polymerization initiator. This composition was fed into a cell that was defined by two glass plates separated by a Teflon spacer with thickness of 3 mm. The cell was heated at 60° C. for 3 hours and then at 200° C. for 30 minutes in an oven, and then was gradually cooled to room temperature to form a colorless transparent hardened plate article. The observed properties of the hardened article are shown in Table 2.

Example 9

A curable composition was prepared by mixing 21 g of 1-adamantyl methacrylate (made by Idemitsu Kosan Co., Ltd.) with 7 g of polyethylene glycol dimethacrylate (NK ESTER 9G made by SHIN-NAKAMURA CHEMICAL CO. LTD.) as a crosslinkable monomer and 0.12 g of bis(4-t-butylcyclohexyl) peroxydicarbonate (PERROYL TCP made by NOF CORPORATION) as a radical polymerization initiator. This composition was fed into a cell that was defined by two glass plates separated by a Teflon spacer with thickness of 3 mm. The cell was heated at 70° C. for 3 hours and then 160° C. for 1 hour in an oven, and then was gradually cooled to room temperature to form a colorless transparent hardened plate article. The observed properties of the hardened article are shown in Table 1.

Comparative Example 1

A composition was prepared by mixing 14 g of bisphenol A liquid epoxy resin (EPIKOTE 828 made by Japan Epoxy Resins Co., Ltd.) as a monomer with 14 g of methyl hexahydro phthalic anhydride (made by Wako Pure Chemical Industries, Ltd.) and 0.028 g of 1,8-diazabicyclo[5.4.0]undec-7-ene (made by Sigma Aldrich Japan). This composition was fed into between sealed Teflon spacers. The cell was gradually heated to 130° C. for 3 hours in an oven and then was gradually cooled to room temperature to form a plate article. The observed properties of the hardened article are shown in Tables 1 and 2.

TABLE 1

| | Example 1 | Example 2 | Example 3 | Example 4 | Example 5 | Example 6 | Example 7 | Example 8 | Example 9 | Comparative Example 1 |
|---|---|---|---|---|---|---|---|---|---|---|
| Material (g) (Methacrylic monomer) | | | | | | | | | | |
| 1-Adamantyl methacrylate | 21 | | | | 21 | 21 | 21 | 22 | 21 | |
| Dicyclopentanyl methacrylate | | 21 | | | | | | | | |
| Isobornyl methacrylate | | | 21 | | | | | | | |
| Norbornyl methacrylate | | | | 21 | | | | | | |
| Methyl methacrylate | | | | | | | | 2.5 | | |
| Bisphenol A liquid epoxy resin | | | | | | | | | | 14 |
| methylhexahydrophthalic anhydride | | | | | | | | | | 14 |
| (Polymerization initiator) | | | | | | | | | | |
| PERHEXA 3M-95 | 0.021 | | 0.021 | 0.021 | 0.021 | 0.021 | 0.021 | | | |
| PERCUMYL P | | | | | | | 0.021 | | | |
| Azobisisobutyronitrile | | 0.021 | | | | | | | | |
| 1,8-Diazabicyclo[5.4.0]undec-7-ene | | | | | | | | | | 0.028 |
| PERROYL TCP | | | | | | | | 0.068 | 0.12 | |
| (Crosslinkable monomer) | | | | | | | | | | |
| Ethylene glycol dimethacrylate | | | | | 0.42 | 0.42 | | | | |
| Polyethylene glycol dimethacrylate | | | | | | | | | 7 | |
| (Thermoplastic resin) | | | | | | | | | | |
| TOPAS 8007 | | | | | | 2.1 | | | | |
| Properties | | | | | | | | | | |
| (1) Glass transition temperature (° C.) | 200 | 155 | 150 | 172 | 190 | 140 | 147 | 170 | 140 | 122 |

TABLE 1-continued

|  | Example 1 | Example 2 | Example 3 | Example 4 | Example 5 | Example 6 | Example 7 | Example 8 | Example 9 | Comparative Example 1 |
|---|---|---|---|---|---|---|---|---|---|---|
| (2) Light transmission (%) | 92.8 | 92.4 | 93.0 | 92.7 | 92.6 | 90.0 | 92.7 | 92.5 | 92.0 | 86.0 |
| Differential transmission (%) after 140° C., 100 hr | 0.5 | 0.0 | 0.1 | 0.7 | 0.5 | 0.5 | 0.3 | 0.2 | 0.2 | 2.0 |
| (3) Transmittance at 400 nm (%) | 93.0 | 93.0 | 91.0 | 93.0 | 91.0 | 90.0 | 89.0 | 93.0 | 91.0 | 70.0 |
| (4) Weathering test (Measurement of Yellowness) | | | | | | | | | | |
| $\Delta YI^1$: Weatherability (UV rays) | 2.4 | 2.5 | 3.8 | 2.9 | 2.2 | 3.0 | 2.6 | 2.5 | 2.2 | 12.0 |
| $\Delta YI^2$: Heat resistance (140° C. 100 hr) | 1.2 | 1.1 | 1.7 | 1.4 | 1.2 | 2.0 | 1.1 | 1.2 | 1.2 | 18.0 |
| (5) Flexural modulus (MPa) | 3100 | 3000 | 2700 | 2800 | 3100 | 3000 | 3000 | 3000 | 2900 | 3100 |
| (6) Softening point (° C.) | 220 | 173 | 170 | 205 | 240 | 230 | 225 | 203 | 148 | 149 |

Example 10

A curable composition was prepared by mixing 18.9 g of 1-adamantyl methacrylate (made by Idemitsu Kosan Co., Ltd.) with 2.1 g of 1,4-butanediol glycidyl ether diacrylate (made by SHIN-NAKAMURA CHEMICAL CO., LTD.) and 0.021 g of PERHEXA 3M-95 (made by NOF CORPORATION) as a polymerization initiator. This composition was fed into a cell that was defined by two glass plates separated by a Teflon spacer with thickness of 3 mm. The cell was heated at 100° C. for 1 hour, 110° C. for 1 hour, 120° C. for 1 hour, and then 130° C. for 30 minutes in an oven, and then was gradually cooled to room temperature to form a colorless transparent hardened plate article. The observed properties of the hardened article (resin) are shown in Table 2.

Example 11

A hardened article was prepared as in Example 10, except that dicyclopentadienyl methacrylate (FANCRYL FM-513 made by Hitachi Chemical Company, Ltd) was used instead of 1-adamantyl methacrylate in Example 1. The observed properties of the hardened article are shown in Table 2.

Example 12

A hardened article was prepared as in Example 10, except that norbornyl methacrylate (made by Wako Pure Chemical Industries, Ltd.) was used instead of 1-adamantyl methacrylate. The observed properties of the hardened article are shown in Table 2.

Example 13

A hardened article was prepared as in Example 1, except that the amount of 1-adamantyl methacrylate was changed to 14 g and the amount of 1,4-butanediol glycidyl ether diacrylate was changed to 7 g in Example 10. The observed properties of the hardened article are shown in Table 2.

Example 14

A hardened article was prepared as in Example 10, except that the amount of 1-adamantyl methacrylate was changed to 15.8 g and 3.1 g of ethylene glycol dimethacrylate (made by Wako Pure Chemical Industries, Ltd.) was further added as a crosslinkable monomer in Example 1. The observed properties of the hardened article are shown in Table 2.

Comparative Example 2

A hardened article was prepared as in Example 10, except that the amount of 1-adamantyl methacrylate was changed to 21 g and the amount of 1,4-butanediol glycidyl ether diacrylate was changed to 0 g. The observed properties of the hardened article are shown in Table 2.

Comparative Example 3

A hardened article was prepared as in Example 14, except that the amount of 1,4-butanediol glycidyl ether diacrylate to 0 g and the amount of ethylene glycol dimethacrylate was changed to 5.2 g. The observed properties of the hardened article are shown in Table 2.

TABLE 2

|  | Example 10 | Example 11 | Example 12 | Example 13 | Example 14 | Comparative Example 2 | Comparative Example 3 | Comparative Example 1 |
|---|---|---|---|---|---|---|---|---|
| Material (g) | | | | | | | | |
| (Methacrylate monomer) | | | | | | | | |
| 1-Adamantyl methacrylate | 18.9 | | | 14 | 15.8 | 21 | 15.8 | |
| Dicyclopentadienyl methacrylate | | 18.9 | | | | | | |
| Norbornyl methacrylate | | | 18.9 | | | | | |
| (Acrylate containing hydroxyl group) | | | | | | | | |
| 1,4-Butanediol diglycidyl ether diacrylate | 2.1 | 2.1 | 2.1 | 7 | 2.1 | | | |
| (Epoxy resin) | | | | | | | | |
| Bisphenol A liquid epoxy resin | | | | | | | | 14 |

TABLE 2-continued

|  | Example 10 | Example 11 | Example 12 | Example 13 | Example 14 | Comparative Example 2 | Comparative Example 3 | Comparative Example 1 |
|---|---|---|---|---|---|---|---|---|
| (Acid anhydride) | | | | | | | | |
| Methylhexahydrophthalic anhydride | | | | | | | | 14 |
| (Polymerization Initiator) | | | | | | | | |
| PERHEXA 3M-95 | 0.021 | 0.021 | 0.021 | 0.021 | 0.021 | 0.021 | 0.021 | |
| 1,8-Diazabicyclo[5.4.0]undec-7-ene | | | | | | | | 0.028 |
| (Crosslinkable monomer) | | | | | | | | |
| Ethylene glycol dimethacrylate | | | | | 3.1 | | 5.2 | |
| Properties | | | | | | | | |
| (1) Refractive index | 1.52 | 1.52 | 1.52 | 1.52 | 1.52 | 1.52 | 1.52 | 1.56 |
| (2) Light transmission (%) | 91.4 | 91.7 | 92 | 90.6 | 91.1 | 92.8 | 91.5 | 86 |
| Differential transmission (%) after 140° C., 100 hr | 0.5 | 0.3 | 0.7 | 0.7 | 0.5 | 0.5 | 0.5 | 2 |
| (3) Transmittance at 400 nm (%) | 91.9 | 92.1 | 92.2 | 91 | 91.6 | 93 | 92.1 | 70 |
| (4) Weathering test (Measurement of Yellowness) | | | | | | | | |
| $\Delta YI^1$: Weatherability (UV rays) | 2.5 | 2.6 | 3 | 2.7 | 2.3 | 2.4 | 2.5 | 12 |
| $\Delta YI^2$: Heat resistance (140° C. 100 hr) | 1.3 | 1.2 | 1.5 | 1.6 | 1.1 | 1.2 | 1.4 | 18 |
| (5) Adhesion test | | | | | | | | |
| Adhesive strength (N): UV unirradiated | 516 | 503 | 544 | 637 | 551 | 138 | 189 | 779 |
| Adhesive strength(N): UV irradiated | 775 | 690 | 737 | 795 | 723 | 151 | 136 | 762 |
| Number of components bonded to reflector (per 10 sample): UV unirradiated | 8 | 7 | 7 | 10 | 8 | 3 | 3 | 10 |
| Number of components bonded to reflector (per 10 sample): UV irradiated | 10 | 10 | 10 | 10 | 10 | 3 | 3 | 10 |
| (6) Softening point (° C.) | 212 | 170 | 198 | 160 | 163 | 220 | 158 | 149 |

INDUSTRIAL APPLICABILITY

The optical semiconductor sealing material of the present invention is highly transparent and stable to UV light and thus does not undergo yellowing. In addition, the material exhibits excellent compatibility between heat resistance and refractive index, does not undergo deformation or cracking during heating processes such as reflow soldering, and shows high processability. The material can be preferably used as a sealing material for light-emitting elements and light-receiving elements of optical semiconductor devices (semiconductor light-emitting devices).

The invention claimed is:

1. A light-emitting diode sealed with an optical semiconductor sealing material comprising a radically polymerized polymer of monomers comprising 50 to 97 mass % methacrylate ester having an adamantyl group and 3 to 50 mass % (meth)acrylate ester having a hydroxyl group.

2. A method of sealing a light-emitting diode comprising a step of sealing a light-emitting diode with a radically polymerized polymer of 50 to 97 mass % methacrylate ester having an adamantyl group and 3 to 50 mass % acrylate ester having a hydroxyl group.

3. The method of claim 2, wherein the radically polymerized polymer is a radically polymerized polymer of monomers consisting of 50 to 97 mass % methacrylate ester having an adamantyl group, 3 to 50 mass % acrylate ester having a hydroxyl group, an optional crosslinkable monomer, and an optional other (meth)acrylate ester.

4. The light-emitting diode of claim 1, wherein the methacrylate ester having an adamantyl group has a 1-adamantyl group.

5. The light-emitting diode of claim 1, wherein the (meth)acrylate ester having a hydroxyl group comprises at least one member selected from the group consisting of 2-hydroxyethyl methacrylate, 2-hydroxypropyl methacrylate, 2-hydroxyethyl acrylate, 2-hydroxypropyl acrylate, 2-hydroxybutyl methacrylate, glycerol dimethacrylate, 2-hydroxy-3-acryloyloxypropyl methacrylate, 2-hydroxybutyl acrylate, 2-hydroxy-3-phenoxypropyl acrylate, 2-hydroxy-3-acryloyloxypropyl acrylate, 2-hydroxy-3-phenoxypropyl methacrylate, hexahydrophthalic acid diglycidyl ester modified with acrylic acid, ethylene glycol diglycidyl ether modified with methacrylic acid, polyethylene glycol glycidyl ether modified with methacrylic acid, diethylene glycol diglycidyl ether modified with methacrylic acid, and 1,4-butanediol diglycidyl ether diacrylate.

6. The light-emitting diode of claim 1, wherein the monomers further comprise a crosslinkable monomer.

7. The light-emitting diode of claim 6, wherein the crosslinkable monomer comprises at least one member selected from the group consisting of 1,4-butanediol(meth)acrylate, 1,6-hexanediol di(meth)acrylate, 1,9-nonanediol di(meth)acrylate, neopentyldiol di(meth)acrylate, polyethylene glycol di(meth)acrylate, polypropylene glycol di(meth)acrylate, ethylene oxide-modified bisphenol A di(meth)acrylate, propylene oxide-modified bisphenol A di(meth)acrylate, epichlorohydrin-modified bisphenol A di(meth)acrylate, propylene oxide-modified glycerol tri(meth)acrylate, trimethylolpropane tri(meth)acrylate, ditrimethylolpropane tetra(meth)acrylate, dipentaerythritol hexa(meth)acrylate, and tris(acroyloxyethyl)isocyanurate.

8. The light-emitting diode of claim 1, wherein the monomers further comprise at least one other (meth)acrylate ester.

9. The light-emitting diode of claim 8, wherein the other (meth)acrylate ester is at least one member selected from the group consisting of methyl acrylate, fluoromethyl acrylate, ethyl acrylate, butyl acrylate, isobutyl acrylate, tert-butyl acrylate, 2,2,2-trifluoroethyl acrylate, 2-hydroxyethyl acrylate, 1,2,2,2-tetrachloroethyl acrylate, propyl acrylate, isopropyl acrylate, 2-chloro-1-(chlorodifluoromethyl)ethyl acrylate, 1,2,2,2-tetrafluoro-1-(trifluoromethyl)ethyl acrylate, 2,2,2-trifluoro-1-(trifluoromethyl)ethyl acrylate, 2,2,3,3,3-pentafluoropropyl acrylate, 1-methylethyl acrylate, 2-(methylthio)ethyl acrylate, 2-methoxyethyl acrylate, 2-hydroxypropyl acrylate, 2-propenyl acrylate, 1-ethoxy-2,2,2-trifluoroethyl acrylate, 2-(ethylthio)ethyl acrylate, 2-ethoxyethyl acrylate, 2,2,3,3,4,4,4-heptafluorobutyl acrylate, 3-(methylthio)propyl acrylate, 1-methylpropyl acrylate, 2,2,3,4,4,4-hexafluorobutyl acrylate, 4-oxapentyl acrylate, 2-(trifluoroethoxy)ethyl acrylate, 2-(1,1,2,2-tetrafluoroethoxy)ethyl acrylate, 3-(ethylthio)propyl acrylate, 1-ethylpropyl acrylate, 2,2,3,3,4,4,5,5-octafluoropentyl acrylate, 2,2-dimethylpropyl acrylate, 2,2,3,3,4,4,5,5,5-nonafluoropentyl acrylate, 4-methylthiobutyl acrylate, 2-methylbutyl acrylate, 3-methylbutyl acrylate, 4-oxahexyl acrylate, 3-methoxybutyl acrylate, hexyl acrylate, cyclohexyl acrylate, 2-ethylbutyl acrylate, 2-methylpentyl acrylate, 4-methyl-2-pentyl acrylate, phenyl acrylate, 2-chlorophenyl acrylate, 4-chlorophenyl acrylate, 2,4-dichlorophenyl acrylate, pentachloro acrylate, 3,3,4,4,5,5,6,6,6-undecafluoro acrylate, pentafluoro acrylate, heptyl acrylate, phenylmethyl acrylate, 2-methylphenyl acrylate, 3-methylphenyl acrylate, 4-methylphenyl acrylate, 1-methylhexyl acrylate, 4-methoxyphenyl acrylate, octyl acrylate, 2-phenylethyl acrylate, 1-methylheptyl acrylate, nonyl acrylate, and decyl acrylate, methyl methacrylate, ethyl methacrylate, 2-chloroethyl methacrylate, 2,2,2-trifluoroethyl methacrylate, 2-nitroethyl methacrylate, 2-hydroxyethyl methacrylate, propyl methacrylate, isopropyl methacrylate, 2-methoxyethyl methacrylate, allyl methacrylate, glycidyl methacrylate, 2-chloropropyl methacrylate, trimethylsilyl methacrylate, 2,2,2-trifluoro-1-methylethyl methacrylate, 2,2,3,3-tetrafluoropropyl methacrylate, heptafluoroisopropyl methacrylate, hexafluoroisopropyl methacrylate, butyl methacrylate, isobutyl methacrylate, sec-butyl methacrylate, tert-butyl methacrylate, 2-ethoxyethyl methacrylate, diethylene glycol methacrylate, nonafluoro-tert-butyl methacrylate, 2,2,3,3,4,4,4-heptafluorobutyl methacrylate, pentyl methacrylate, cyclopentyl methacrylate, 2,2-diethylpropyl methacrylate, 1-methylbutyl methacrylate, isoamyl methacrylate, 2,2,3,3,4,4,5,6-octafluoropentyl methacrylate, hexyl methacrylate, cyclohexyl methacrylate, phenyl methacrylate, 3,3-dimethylbutyl methacrylate, 2-ethylbutyl methacrylate, 1-methylcyclohexyl methacrylate, 2-methylcyclohexyl methacrylate, 3-methylcyclohexyl methacrylate, 4-methylcyclohexyl methacrylate, 1,1-diethylpropyl methacrylate, 2-methylphenyl methacrylate, 3-methylphenyl methacrylate, 4-methylphenyl methacrylate, benzyl methacrylate, 2-methoxyphenyl methacrylate, 2,2,3,3,4,4,5,5,6,6,7,7-dodecafluoroheptyl methacrylate, octyl methacrylate, 2-ethylhexyl methacrylate, 2-phenylethyl methacrylate, 2,4-dimethylphenyl methacrylate, 2,5-dimethylphenyl methacrylate, 2,6-dimethylphenyl methacrylate, 3,5-dimethylphenyl methacrylate, nonyl methacrylate, decyl methacrylate, and isodecyl methacrylate.

\* \* \* \* \*